United States Patent
Anazawa et al.

(10) Patent No.: US 7,132,039 B2
(45) Date of Patent: *Nov. 7, 2006

(54) MANUFACTURING APPARATUS AND METHOD FOR CARBON NANOTUBE

(75) Inventors: Kazunori Anazawa, Nakai-machi (JP);
Hiroyuki Watanabe, Nakai-machi (JP);
Kentaro Kishi, Nakai-machi (JP);
Masaki Hirakata, Nakai-machi (JP);
Masaaki Shimizu, Nakai-machi (JP)

(73) Assignee: Fuji Xerox Co., Ltd., Tokyo (JP)

( * ) Notice: Subject to any disclaimer, the term of this patent is extended or adjusted under 35 U.S.C. 154(b) by 278 days.

This patent is subject to a terminal disclaimer.

(21) Appl. No.: 10/600,352

(22) Filed: Jun. 23, 2003

(65) Prior Publication Data

US 2004/0084297 A1    May 6, 2004

(30) Foreign Application Priority Data

Nov. 6, 2002    (JP)    ............ 2002-322482

(51) Int. Cl.
*C01B 31/00*    (2006.01)
(52) U.S. Cl. ............ 204/173; 422/186.03; 422/186.21; 422/186.22
(58) Field of Classification Search ............ 422/186.03, 422/186.21, 186.22; 204/173

See application file for complete search history.

(56) References Cited

U.S. PATENT DOCUMENTS

2002/0179428 A1    12/2002    Anazawa et al. ............ 204/173

FOREIGN PATENT DOCUMENTS

JP    8-48510    *    2/1996

OTHER PUBLICATIONS

Yokomichi et al., "Effects of high magnetic field on the morphology of carbon nanotubes and selective synthesis of fullereness", Mar. 29, 1999, Applied Physics Letters, vol. 74, No. 13, p. 1827-1829.*
Anazawa et al., High-purity carbon nanotubes synthesis method by an arc discharging in magnetic field, Applied Physics Letters, vol. 81, No. 4, pp. 739-741, Jul. 2002.

* cited by examiner

*Primary Examiner*—Rodney G. McDonald
(74) *Attorney, Agent, or Firm*—Oliff & Berridge, PLC (57) ABSTRACT

An apparatus for manufacturing a carbon nanotube includes: at least two electrodes whose tips oppose to each other; a power supply which applies a voltage between the electrodes so as to generate discharge plasma in a discharge area between the electrodes; a plurality of magnets which generates at least one of a magnetic field having lines of magnetic force in multiple directions or a magnetic field having a component in parallel with the direction of a discharge current in the generation area of the discharge plasma; and a magnet cooling unit which cools the magnets.

33 Claims, 6 Drawing Sheets

MANUFACTURING APPARATUS AND METHOD FOR CARBON NANOTUBE

FIELD OF THE INVENTION AND RELATED ART STATEMENT

The present invention relates to a manufacturing apparatus and method for a carbon nanotube whose industrial usability has been attracting attention recently.

The material having a diameter of 1 µm or smaller which is finer than carbon fibers, is generally called carbon nanotubes and distinguished from the carbon fibers. However, there is no particularly definite boundary therebetween. By a narrow definition, the material whose carbon faces with hexagon meshes are almost parallel to the axis of the tube is called a carbon nanotube, and even a variant of the carbon nanotube, around which amorphous carbon exists, is included in the carbon nanotube (Note that the narrow definition is applied to the carbon nanotube according to the present invention.).

Usually, the narrowly-defined carbon nanotubes are further classified into two types: carbon nanotubes having a structure with a single hexagon mesh tube (graphene sheet) are called single wall nanotubes (hereafter, simply referred to as "SWNT" in some cases); and the carbon nanotubes made of multilayer graphene sheets are called multi-wall nanotubes (hereafter, simply referred to as "MWNT" in some cases). The carbon nanotubes has exceedingly finer diameter than that of carbon fibers, a high Young's modulus, and electrical conductivity in nature, thereby being attracting attention as a new industrial material.

As described above, the carbon nanotube is a new material whose constituting element is only carbon, and is kinetically strong enough to exceed a Young's modulus of 1 TPa. In addition, electrons flowing through the carbon nanotube easily undergo ballistic transport, so that it is possible to flow a large quantity of current. Further, the carbon nanotube has a high aspect ratio, so that its application to a field electron emitting source is underway, and a light emitting element and display with a high brightness is under development. Some single wall carbon nanotubes exhibit semiconductor characteristics, and are applied to experimentally manufacturing a diode and a transistor. Thus, its application is especially desired in the field of functional materials and in the electronic industry.

Conventionally, it has been know that fullerenes and carbon nanotubes can be manufactured by methods including resistance heating, plasma discharge such as arc discharge with a carbon rod as a raw material, laser ablation, and chemical vapor deposition (CVD) using acetylene gas. However, the mechanism of generating carbon nanotubes with those methods is controversial, and the detailed growth mechanism is not disclosed even now.

With regard to the manufacture of carbon nanotubes, different methods and improvements have been studied for synthesizing them in a large quantity. The resistance heating which was devised earlier is a method to heat and vaporize graphite by bringing the tips of two graphite in contact with each other in rare gas, and applying several tens to several hundreds of amperes of a current. However, with this method, it is very difficult to obtain a few grams of specimen, so that the method is hardly used now.

The arc discharge is a method of synthesizing fullerenes and carbon nanotubes by generating arc discharge in rare gas such as He and Ar while using graphite rods as an anode and a cathode. The tip of the anode reaches a high temperature of 4000° C. or more by arc plasma generated by the arc discharge, then the tip of the anode is vaporized, and a large quantity of carbon radicals and neutral particles are generated. The carbon radicals and neutral particles repeat collision in the plasma, further generate carbon radicals and ions, and become soot containing fullerenes and carbon nanotubes to be deposited around the anode and cathodes and on the inner wall of the apparatus. When the anode includes Ni compound, ferrous compound, or rare earth compound, which acts as catalyst, the single wall carbon nanotubes are synthesized efficiently.

The laser ablation is a method of irradiating pulse YAG laser beam on a graphite target, generating high density plasma on the surface of the graphite target, and generating fullerenes and carbon nanotubes. The characteristic of the method is that carbon nanotubes with relatively high purity can be obtained even at a growth temperature of more than 1000° C.

A technique for higher purity synthesis of the SWNT for increasing the purity in the laser ablation is reported in A. Thess et. al, "Nature", Vol. 273, p. 483–487. However, the laser ablation supplies only a small quantity of carbon nanotubes, and the efficiency is low, leading to high cost of carbon nanotubes. In addition, the purity remains about 70 to 90%, and is not sufficiently high.

The chemical vapor deposition is a method of using acetylene gas, methane gas, or the like that contains carbon as a raw material, and generating carbon nanotubes in chemical decomposition reaction of the raw material gas. The chemical vapor deposition depends on chemical reaction occurring in the thermal decomposition process of the methane gas and the like serving as the raw material, thereby enabling the manufacture of carbon nanotubes having high purity.

However, in the chemical vapor deposition, the growth rate of the carbon nanotube is extremely low, the efficiency is low, and industrial application is difficult. In addition, the structure of the manufactured carbon nanotubes has more defects and is incomplete compared with that synthesized in the arc discharge and the laser ablation.

The use of a vertical furnace may enable continuous growth, thereby realizing a growth apparatus having a high production capability. However, in that case, the purity of the obtained carbon nanotubes remains low.

Electrons, ions of carbon, radicals, and neutral particles in the arc plasma generated by the arc discharge repeat recollision, thereby generating complex chemical reactions, so that it is difficult to stably control the density and the kinetic energy of the carbon ions. Thus, a large amount of amorphous carbon particles, and graphite particles are generated simultaneously along with the fullerenes and the carbon nanotubes, and all of them exist in a mixed state as soot.

Thus, when the fullerenes and the carbon nanotubes are to be used for industrial application, it is necessary to purify and separate only the fullerenes and carbon nanotubes from the soot. Especially, the carbon nanotubes are not dissolved in solvent, so that the purification is conducted by combining centrifugation, oxidation, filtering, and the like. However, the physical characteristics and chemical characteristics of the carbon nanotubes, and those of the amorphous carbon particles and the graphite particles, which are major impurity, are approximately equal, thereby making it difficult to remove the impurity completely. Thus, high purity carbon nanotubes are obtained by repeating purification. It is also known that, in the purification process, alkali metal may remain due to the influence of surface active agent used as dispersing agent, the influence of the kinetic damage is extensive in the purification process, and a large quantity of defects occur in the carbon nanotubes.

To solve this problem, on the synthesis stage of the carbon nanotubes, synthesis technique for high purity carbon nanotubes which include impurities as less as possible, namely carbon nanotubes which do not include amorphous carbon particles and graphite particles is desired.

In the arc discharge and the laser ablation which exhibit small number of defects in the structure of the carbon nanotube, the length of the obtained carbon nanotubes varies, and it is impossible to control the shape. Therefore, when carbon nanotubes with a desired length are to be obtained, it is necessary to separate carbon nanotubes having a desired length after carbon nanotubes are manufactured. Especially in the arc discharge, it is difficult to control the length of the carbon nanotubes to be synthesized. Note that it is possible to use the growth period to control the length of the carbon nanotube in the chemical vapor deposition, but the structure has a large number of defects as described above. Also, the purity of the obtained carbon nanotubes is not sufficiently high in any manufacturing methods, so that it is extremely complex and costly to obtain carbon a no tube switch a desired length in a desired quantity.

The present inventors found that extremely high purity carbon nanotubes can be manufactured by forming a predetermined magnetic field in the generation area of the discharge plasma typically generated by arc discharge (see Kazunori Anazawa, Kei Shimotani, Chikara Manabe, Hiroyuki Watanabe et. al. "High-purity carbon nanotubes synthesis method by an arc discharging in magnetic field", Applied Physics Letters. (2002), Vol. 81, No. 4, p. 739–p. 741). It is contemplated that with this method, the discharge plasma including radicals such as $C^+$, $C$, and $C_2$ are confined in a predetermined magnetic field by generating the discharge plasma in the magnetic field, the collision probability of the charged particles in the discharge plasma increases, thereby increasing the efficiency of generating the carbon nanotubes. As a result, it is possible to reduce the amorphous carbon particles and graphite particles which result in the impurities. With this method, purity of the carbon nanotubes drastically are improved. Thus, the next step is to properly control the shape, especially the length, of the obtained carbon nanotube.

SUMMARY OF THE INVENTION

The present invention solves the problems of the prior art described above. Specifically, the present invention provides a manufacturing apparatus and method which can efficiently synthesize carbon nanotubes with extremely low concentration of impurities such as amorphous carbon particles and the graphite particles on an industrial basis, and simultaneously can properly control the shape, especially the length, of the obtained carbon nanotubes.

The above-mentioned object will be achieved by the following. Thus, an apparatus for manufacturing a carbon nanotube according to the present invention is characterized by including: at least two electrodes whose tips oppose to each other; a power supply which applies a voltage between the electrodes so as to generate discharge plasma in a discharge area between the electrodes; a plurality of magnets which generates at least one of a magnetic field of multiple directions and a magnetic field having a component in parallel with the direction of a discharge current in the generation area of the discharge plasma; and a magnet cooling unit which cools the magnets.

With the carbon nanotube manufacturing apparatus according to the present invention, first, it is possible to efficiently synthesize high purity carbon nanotubes on an industrial basis. As has already been described, it is contemplated that with this method, the discharge plasma including $C^+$, $C$, and $C_2$, are confined in a predetermined magnetic field by generating the discharge plasma in the magnetic field, the collision probability of the charged particles in the discharge plasma increases, thereby increasing the efficiency of generating the carbon nanotube increases.

Further, when the discharge plasma is generated in the discharge area between the electrodes, heat is generated, and thus, the magnets is heated. In general, the magnets such as a magnet loses the magnetic field intensity when its temperature reaches the Curie temperature. With this respect, the carbon nanotube manufacturing apparatus according to the present invention is provided with the magnet cooling unit for cooling the magnets, so that the heating of the magnets is restrained, and it is possible to maintain generating discharge plasma for a long period. As a result of verification by the present inventors, when the discharge plasma is generated in the predetermined magnetic field, it was found for the first time that the length of the carbon nanotube extends as the time elapses. Therefore, with the carbon nanotube manufacturing apparatus according to the present invention, it is possible to control the generation period of the discharge plasma as the need arises, thereby enabling appropriate control of the shape, especially the length, of the carbon nanotubes.

The magnet cooling unit can be formed by attaching a heat releasing member to the magnets, or by bringing a cooling tube in contact with the magnets, and circulates a coolant in the cooling tube.

It is also preferable that the carbon nanotube manufacturing apparatus of the present invention is provided with an electrode cooling unit for cooling at least one of the two electrodes. The heat generated when the discharge plasma is generated also heats the two electrodes, so that the entire electrodes are vaporized when the electrodes are kept at a high temperature for a long time, and their diameter and shape change. Accordingly, the discharge current density and the voltage drop may change, or the carbon nanotubes generated and deposited at the tip of the electrode may be decomposed or vaporized. However, by providing the electrode cooling unit, such possibility is eliminated, the generation of the discharge plasma can be maintained for even a longer period, and thus, the latitude of the control for the shape, especially the length, of the carbon nanotube increases.

In the apparatus for manufacturing a carbon nanotube according to the present invention, arc plasma is preferable as the discharge plasma generated in the discharge area.

The apparatus for manufacturing a carbon nanotube according to the present invention includes, for example, the following three forms as the magnets.

(1)-a A form in which the magnets includes plural magnets selected from the group consisting of permanent magnets and electromagnets arranged along the direction of the discharge current so as to surround at least of the generation area of the discharge plasma and an area close the generation area, and simultaneously, each of the plural magnets is arranged to direct the same pole toward the discharging area.

(1)-b A form in which the magnets includes even number of magnets, equal to or greater than four, selected from the group consisting of permanent magnets and electromagnets arranged along the direction of the discharge current so as to surround at least one of the generation area of the discharge plasma and an area close to the generation area, and simultaneously, each of the plural magnets is arranged to have a pole opposite to that of the adjacent magnet directed toward the discharging area (2) A form in which the magnets is formed of one of one and two coils whose center axis is approximately aligned to the direction of the discharge current.

In the apparatus for manufacturing a carbon nanotube according to the present invention, it is preferable that, of the two electrodes, the magnetic flux density at an edge of the tip of the electrode which generates the discharge plasma is equal to or more than $10^{-5}$ T and equal to or less than 1 T, and that a density of the discharge current when the discharge plasma is generated is 0.05 A/mm$^2$ or more and 15 A/mm$^2$ or less with respect to an area of the tip of the electrode which generates the discharge plasma.

In the apparatus for manufacturing a carbon nanotube according to the present invention, it is preferable that the voltage applied to the electrodes by the power supply is equal to or more than 1 V and equal to or less than 30 V, and is a DC voltage. Also, in the case of the DC voltage, it is more preferable that the area of the tip of a cathode of the two opposing electrodes is equal to or less than the area of the tip of an anode thereof.

In the apparatus for manufacturing a carbon nanotube according to the present invention, it is preferable that at least the discharge area and the electrodes are received in a sealed container, and in the case, it is preferable that an atmosphere adjusting unit is provided for adjusting at least one of a pressure and a gas type of an atmosphere in a sealed container.

In the apparatus for manufacturing a carbon nanotube according to the present invention, it is preferable that the material of the electrodes is one of carbon and a substance which contains carbon and has an electric resistivity equal to or more than 0.01 Ω·cm and equal to or less than 10 Ω·cm.

Also, a method of manufacturing a carbon nanotube by applying a voltage between two electrodes whose tips oppose to each other, and then, generating discharge plasma in a discharge area between the electrodes, the method according to the present invention is characterized by including: using a magnetism generating member to form at least one of a magnetic field having lines of magnetic force in multiple directions and a magnetic field having a component in parallel with the direction of a discharge current in the generation area of the discharge plasma; and cooling the magnets.

With the method of manufacturing the carbon nanotube according to the present invention, first, as stated in the description for the apparatus for manufacturing the carbon nanotube according to the present invention, it is possible to efficiently manufacture high purity carbon nanotubes on an industrial basis. Also, with the carbon nanotube manufacturing method according to the present invention, the magnet cooling unit is provided for cooling the magnets, so that the heating of the magnets is restrained. Accordingly, it is possible to control the generation period of the discharge plasma as the need arises, thereby enabling appropriate control of the shape, especially the length, of the carbon nanotubes.

The method of manufacturing a carbon nanotube according to the present invention preferably further includes: controlling a temperature of the magnets under a Curie temperature; and controlling a period of time when the voltage is applied between the two electrodes appropriately.

In the method of manufacturing a carbon nanotube according to the present invention by cooling the two electrodes is being cooled, the generation of the discharge plasma can be maintained for a much longer period, and thus, the latitude of the control for the shape, especially the length, of the carbon nanotube increases.

In the method of manufacturing a carbon nanotube according to the present invention, it is preferable that the discharge plasma generated in the discharge area is arc plasma.

The apparatus for manufacturing a carbon nanotube according to the present invention includes, for example, the following three methods as the magnets.

(1)-a A method in which plural magnets selected from the group consisting of permanent magnets and electromagnets are arranged along the direction of the discharge current so as to surround at least one of the generation area of the discharge plasma and an area close to the generation area and such that each of the plural magnets is arranged to direct the same pole toward the discharging area.

(1)-b A method in which even number of magnets, equal to or greater than four, selected from the group consisting of permanent magnets and electromagnets are arranged along the direction of the discharge current so as to surround at least one of the generation area of the discharge plasma and an area close to the generation area and such that each of the plural magnets has a pole opposite to that of the adjacent magnet directed toward the discharging area (2) A method in which the magnetic field is formed by disposing one of one and two coils whose center axis is approximately aligned to the direction of the discharge current.

In the method of manufacturing a carbon nanotube according to the present invention, it is preferable that, of the two electrodes, the magnetic flux density at an edge of the tip of the electrode which generates the discharge plasma is equal to or more than $10^{-5}$ T and equal to or less than 1 T, and that a density of the discharge current when the discharge plasma is generated is 0.05 A/mm$^2$ or more and 15 A/mm$^2$ or less with respect to an area of the tip of the electrode which generates the discharge plasma.

In the method of manufacturing a carbon nanotube according to the present invention, it is preferable that the voltage applied to the electrodes is equal to or more than 1 V and equal to or less than 30 V, and that the voltage applied to the electrodes by the power supply is a DC voltage. Also, in the case of the DC voltage, it is more preferable that the area of the tip of a cathode of the two opposing electrodes is equal to or less than the area of the tip of an anode thereof.

In the method of manufacturing a carbon nanotube according to the present invention, it is preferable that the material of the electrodes is one of carbon and a substance which contains carbon and has an electric resistivity equal to or more than 0.01 Ω·cm and equal to or less than 10 Ω·cm.

In the method of manufacturing a carbon nanotube according to the present invention, it is preferable that a pressure of an atmosphere of the discharge area is equal to or more than 0.01 Pa and equal to or less than 510 kPa, and that an atmosphere of the discharge area is a gas atmosphere which contains at least one of gases selected from the group consisting of air, helium, argon, xenon, neon, nitrogen, and hydrogen. Also, it is possible that an atmosphere of the discharge area further includes a gas which includes a substance containing carbon.

BRIEF DESCRIPTION OF THE DRAWINGS

Preferred embodiment of the present invention will be described in detail based on the following drawings wherein:

FIGS. 3(a) and 3(b) show states of the lines of magnetic force where only permanent magnets are extracted from FIG. 2 and magnetic poles are determined, in which

FIGS. 4(a) and 4(b) show specific examples of a magnetic field space where lines of magnetic force are approximately in parallel with the direction of discharge current, and the motion of charged particles in discharge plasma is restricted to the direction of the lines of the magnetic force, in which

FIGS. 5(a) and 5(b) show schematic views showing states where a permanent magnet is surrounded by heat releasing members, in which

DETAILED DESCRIPTION OF THE PREFERRED EMBODIMENT

Detailed description of the present invention will be made hereinbelow.

In a manufacturing apparatus and method for a carbon nanotube according to the present invention, first, by applying a voltage between two electrodes whose tips are opposed to each other, discharge plasma is generated in a discharge area between the electrodes, and a predetermined magnetic field is formed in the discharge area for manufacturing carbon nanotubes. As a result, with the present invention, it is possible to reduce amorphous carbon particles and graphite particles, which result in impurities. The predetermined magnetic field is at least a magnetic field having lines of magnetic force in multiple directions or a magnetic field having a component in parallel with the direction of a discharge current in the generation area of the discharge plasma.

The manufacturing apparatus and the manufacturing method for a carbon nanotube according to the present invention is further characterized in that a magnetism generating member is cooled (the manufacturing apparatus is provided with a magnet cooling unit).

Figure 1:
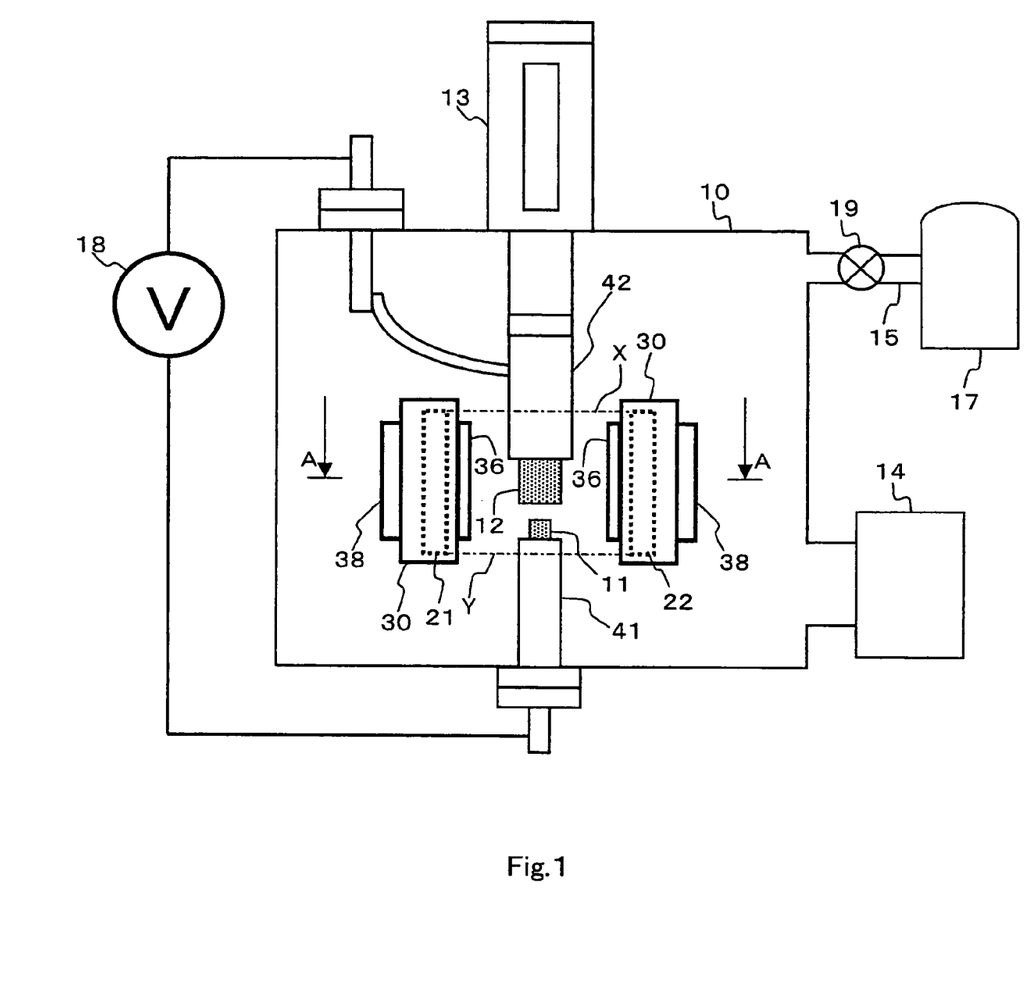
FIG. 1 is a schematic cross sectional view showing an example of an apparatus for manufacturing a carbon nanotube according to the present invention.
Figure 2:
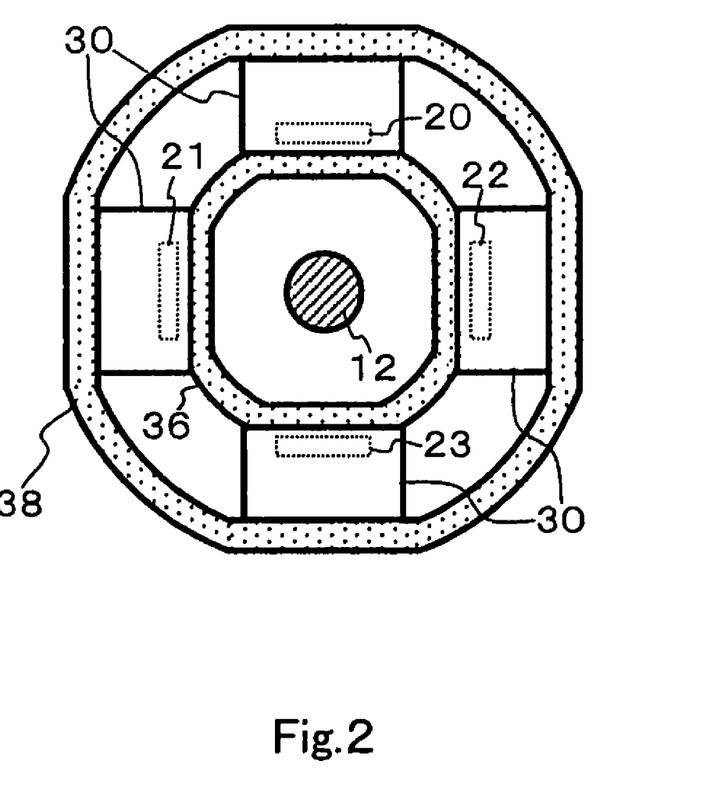
FIG. 2 is a cross sectional view taken along a line A—A of FIG. 1.

FIG. 1 is a schematic cross sectional view showing an example of the manufacturing apparatus for a carbon nanotube according to the present invention, and FIG. 2 is a cross sectional view taken along the line A—A of FIG. 1. The carbon nanotube manufacturing apparatus for a carbon nanotube shown in FIG. 1 further includes permanent magnets 20 to 23 provided with the magnet cooling unit (the magnet cooling unit may be simply referred to as "cooling unit" in the following section) in addition to a conventional carbon nanotube manufacturing apparatus using discharge plasma. The permanent magnets 20 to 23 are arranged along the direction of the discharge current to surround the discharge area. The part corresponding to the conventional carbon nanotube manufacturing apparatus includes two electrodes (an electrode 12 serving as an anode, and an electrode 11 serving as a cathode) which are respectively held by holders 41 and 42, and disposed in a reaction container (chamber) 10 used as a sealed container, and whose tips are opposed to each other, a moving apparatus 13 which can slide the holder 42 holding the electrode 12 for adjusting the interval between the electrode 11 and the electrode 12, a power supply 18 for applying a voltage between the electrodes 11 and 12, a vacuum pump 14 capable of decompressing the atmosphere in the reaction container 10, a gas cylinder 17 for storing desired gas, an inlet tube 15 interconnecting between the gas cylinder 17 and the reaction container 10, and an atmosphere adjusting unit including a valve 19 for opening/closing the interconnection.

Namely, the permanent magnets 20 to 23 generate a predetermined magnetic field in the discharge area between the electrodes 11 and 12 generated by the discharge plasma when a voltage is applied between the electrodes 11 and 12. Note that since the permanent magnets 20 to 23 are completely surrounded by the heat releasing members 30, which area part of the cooling unit, these magnets are represented by a dotted line in FIGS. 1 and 2. The cooling unit is detailed later.

Examples of the formed predetermined magnetic field specifically include (1) a magnetic field space which is surrounded and is enclosed by lines of magnetic force in multiple directions, and (2) a magnetic field space where the lines of magnetic force are approximately in parallel with the direction of the discharge current, and thus, the motion of the charged particles in the discharge plasma is restricted by the lines of magnetic force. As in this example, when the four permanent magnets are used, it is possible to form a magnetic field in the form of (1).

Figures 3A, 3B:
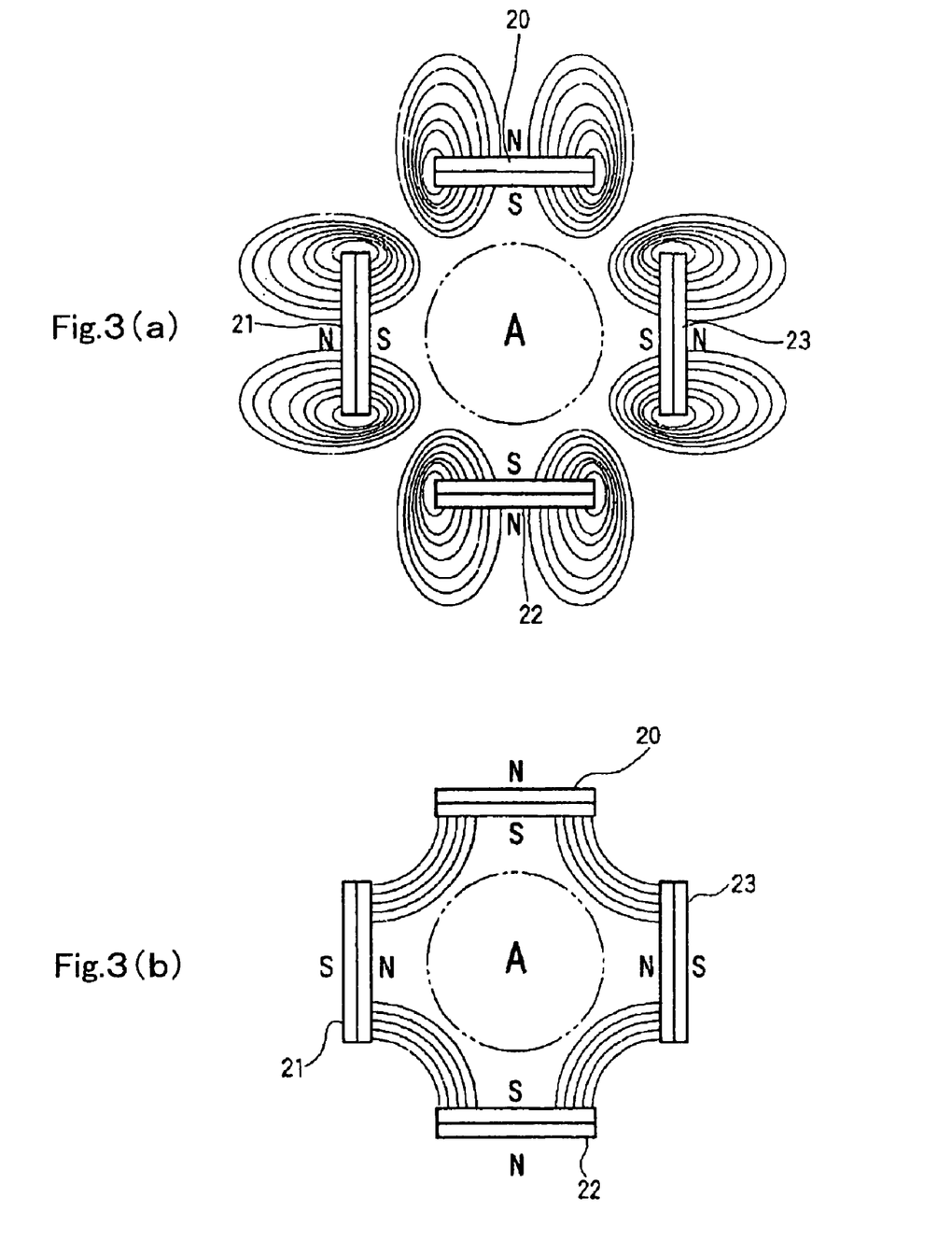
FIG. 3(a) shows a state where all the permanent magnets are arranged such that the S pole faces a discharge area.
FIG. 3(b) shows a state where the permanent magnets are arranged such that the pole of each permanent magnet opposite to that of the adjacent permanent magnet faces the discharge area.

Description will be made of a state of the predetermined magnetic field (1) formed. FIGS. 3(a) and 3(b) show a specific example of the magnetic field space which is surrounded and enclosed by the lines of magnetic force in multiple directions (1). FIGS. 3(a) and 3(b) show states of the lines of the magnetic force when the permanent magnets 20 to 23 are extracted from FIG. 2, and the magnetic poles are determined. The lines of magnetic force are represented by a solid curve. Note that the lines of magnetic force shown in FIGS. 3(a) and 3(b) do not represent all possible forms, but represent typical ones.

FIG. 3(a) shows a state where all the permanent magnets 20 to 23 face the S pole toward the discharging area ((1)-a). In this case, the lines of magnetic force emitted from the individual permanent magnets 20 to 23 toward the discharging area repel one another, and thus, the area indicated by A is surrounded by the lines of magnetic force in different directions.

FIG. 3(b) shows an arrangement where the permanent magnets 20 and 22 face the S pole toward the discharging area, and the permanent magnets 21 and 23 face the N pole toward the discharging area ((1)-b). Namely, the neighboring permanent magnets are arranged so as to face the poles alternately opposite to each other toward the discharging area. In this case, the lines of magnetic force emitted from the individual permanent magnets 20 to 23 toward the discharging area terminate on the neighboring permanent magnets, and thus, the area indicated by A is surrounded by the lines of magnetic force in different multiple directions.

As described above, with the forms shown in FIG. 3(a) and FIG. 3(b), the magnetic field in different directions acts on the area indicated by A, and when the discharge plasma is generated in the area A, it is estimated that the motion of the charged particles in the discharge plasma is restricted in the space between the electrode 11 and the electrode 12. When the carbon nanotubes are manufactured in this way, it is possible to efficiently synthesize carbon nanotubes with high purity at a low cost on an industrial basis.

The magnetic field in these forms may be generated by using multiple permanent magnets, and the number of the magnets is not necessarily limited to four.

In the former "form where all the permanent magnets face the same pole toward the discharging area", three, five, or more flat permanent magnets, for example, may be arranged so as to surround the discharge area, or even two magnets may be arranged such that recesses of both of them face each other when curved permanent magnets are used. In addition, there is no upper limit to the number of the permanent magnets. Further, while the S poles face the discharge area in the form shown in FIG. 3(a), it is only necessary to face the same poles toward the discharging area, namely an arrangement where the N poles face the discharge area may be possible.

In the latter "form where the neighboring permanent magnets are arranged so as to face the poles alternately opposite to each other toward the discharging area", since it is necessary to alternate the pole of the neighboring permanent magnets, it is essential to use even number of permanent magnets. Also, it is necessary to surround the discharge area with lines of magnetic force, so it is essential to use four or more permanent magnets. However, there is no upper limit.

Another example of the predetermined magnetic field in the form of (1) as described above may be a form where the discharge plasma is generated in an internal hole of a permanent magnet in a cylindrical shape.

While the above description is provided for the form (1) of the predetermined magnetic field where the permanent magnets are used, the magnets to be used are not limited to the permanent magnets, and it is possible to use electromagnets or a combination of permanent magnets and electromagnets.

Figure 4A:
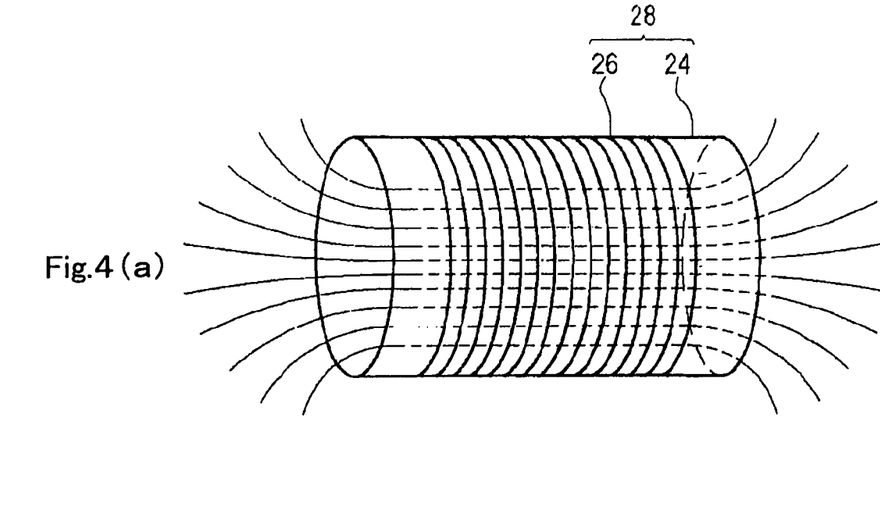
FIG. 4(a) is a perspective view showing a state of the lines of magnetic force formed when a voltage is applied to a coil of an electromagnet.
Figure 4B:
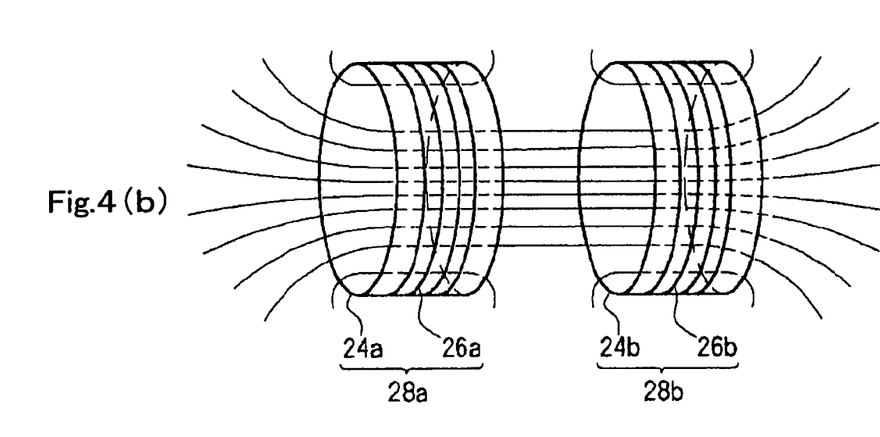
FIG. 4(b) is a perspective view showing a state of the lines of magnetic force when electromagnets are disposed on the same axis with an interval, and a voltage is applied to coils of the respective electromagnets.

Description will be made of a state of the predetermined magnetic field (2) formed. FIGS. 4(a) and 4(b) show specific examples of a magnetic field space (2) where the lines of magnetic force are approximately in parallel with the direction of the discharge current, and the motion of the charged particles in the discharge plasma is restricted by the lines of magnetic force. FIG. 4(a) is a perspective view showing a state of the lines of magnetic force formed when a voltage is applied to a coil 26 of an electromagnet 28 obtained by winding the coil 26 on a cylinder 24, and FIG. 4(b) is a perspective view showing a state of the lines of magnetic force when electromagnets 28a and 28b obtained in the same way are disposed on the same axis with an interval, and a voltage is applied to coils 26a and 26b wound on individual cylinders 24a and 24b. The lines of magnetic force are represented by a solid curve and a broken curve. Note that the lines of magnetic force shown in FIGS. 4(a) and 4(b) do not represent all possible forms, but represent typical ones, and as for the individual lines of magnetic force, a part of them are shown.

In the form shown in FIG. 4(a), the lines of magnetic force pass through the inside of the cylinder 24. Namely, the lines of the magnetic force form a flux of lines of the magnetic force approximately in parallel inside the cylinder 24. By generating discharge plasma inside the cylinder 24, and approximately matching the direction of the lines of magnetic force inside the cylinder 24 with the direction of the discharge current, it is contemplated that the discharge plasma is confined inside the magnetic field.

In the form shown in FIG. 4(b), the lines of the magnetic force pass through the inside of the cylinders 24a and 24b respectively, and simultaneously, a combined magnetic field is formed in the interval between them. In the combined magnetic field, the lines of the magnetic force passing through the inside of the cylinders 24a and 24b respectively proceed simply straight, pass through the inside of the other cylinder, and practically form an imaginary single coil though an extremely small portion of the lines of the magnetic force digress from the space between the cylinders 24a and 24b. Namely, in the space between the cylinders 24a and 24b, the lines of magnetic force form a flux of lines of magnetic force approximately in parallel. By generating discharge plasma in the space between the cylinders 24a and 24b, and approximately matching the direction of the lines of magnetic force inside the cylinders 24a and 24b with the direction of the discharge current, it is contemplated that the discharge plasma is confined inside the magnetic field.

It is not necessary to exactly match the direction of the lines of the magnetic force inside the cylinder 24 or the space between the cylinders 24a and 24b with the direction of the discharge current. Even when their directions do not match each other exactly, it is only necessary to form a magnetic field which confines the discharge plasma inside. However, when the angle between them is excessively large, the electrodes may be broken due to the relationship among the magnetic field, the electric field, and the force, the angle is preferably set to a range of from 0° to 30°, and more preferably to a range of from 0° to 10°.

In addition, even if the direction of the discharge current does not match exactly the center axis of the magnetic field, it is only necessary to confine the discharge plasma inside the magnetic field. Note that since the straightness of the discharge plasma is lost if the discharge plasma is generated at a location excessively separated from the center axis of the magnetic field, it is desirable that the axis of the direction of the discharge current exists within 20% of the distance from the center axis of the magnetic field to "the inner surface of the cylinder 24" or "the extension of the inner surface of the cylinders 24a and 24b". Note that when the tip of the electrode is a flat surface, since the discharge plasma is generated while an arbitrary point on the flat surface is serving as a base point, though the direction of the discharge current is not constant inherently, it is assumed that the line connecting the centers of the tips of the two electrodes opposed to each other is the direction of the discharge current in the present invention.

Another example of the predetermined magnetic field in the form of (2) may be a form where a troidal electromagnet is used, and the discharge plasma is generated in an internal hole of the electromagnet.

Though the types of the discharge plasma include arc plasma, glow plasma, and the like, arc plasma is preferable for efficiently manufacturing carbon nanotubes.

While in this embodiment, as shown in FIG. 1, the area in which both of the tips of the electrodes 11 and 12 are opposed to each other, namely the generation area of the discharge plasma, is situated in the area surrounded by the permanent magnets 20 to 23 (between an imaginary plane X formed by connecting top ends of the permanent magnets 20 to 23 in the axial direction of the electrode 12 in the drawing and an imaginary plane Y formed by connecting bottom ends of them), the permanent magnets 20 to 23 do not necessarily surround directly the generation area of the discharge plasma, but may surround its neighboring area. This is because the magnetic field due to the permanent magnets 20 to 23 is also formed in the neighboring area surrounded by the permanent magnets 20 to 23, and the discharge plasma is properly confined in the magnetic field.

Since the distance of the electrode 12 from the imaginary plane Y (the area which can be considered as the neighboring area surrounded by the permanent magnets 20 to 23) is determined so that the magnetic field formed by the permanent magnets 20 to 23 affects the generation area of the discharge plasma between the electrodes 11 and 12, the distance is automatically determined according to the magnetic force of the permanent magnets 20 to 23 and the like. Specifically, it is preferable to set the distance within a range which satisfies "the magnetic flux density in the discharge area" described later.

Note that it is preferable that the generation area of the discharge plasma is separated from the center of the area surrounded by the permanent magnets 20 to 23 (the center between the imaginary plane X and the imaginary plane Y) by a certain distance. At the center of the area surrounded by the permanent magnets 20 to 23, the direction of the formed magnetic field is, in most cases, orthogonal to the axial direction of the electrode 12, or the magnetic field is hardly formed since components of the magnetic field cancel out. When the generation area is displaced from the center position, the intensity of the magnetic field increases or the magnetic flux density of the magnetic field having the vector component effective for confining the discharge plasma increases further. Under this condition, a preferable area exists even in the neighborhood of the area surrounded by the permanent magnets 20 to 23. Specifically, as described above, this area is within the range which satisfies "the magnetic flux density in the discharge area" described later.

The range of the interval between both of the tips of the electrodes 11 and 12 is selected from the range in the level of generated discharge plasma, and is automatically determined according to the voltage drop. In general, the interval may be selected from a range of from about 0.1 to 5 mm.

The following section details the cooling unit specific to the present invention.

Figure 5A:
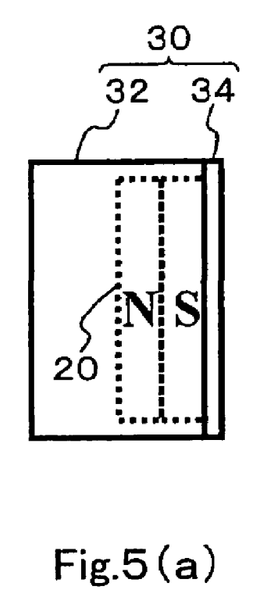
FIG. 5(a) shows a side view of the vicinity of the permanent magnet to which the heat releasing members are attached.
Figure 5B:
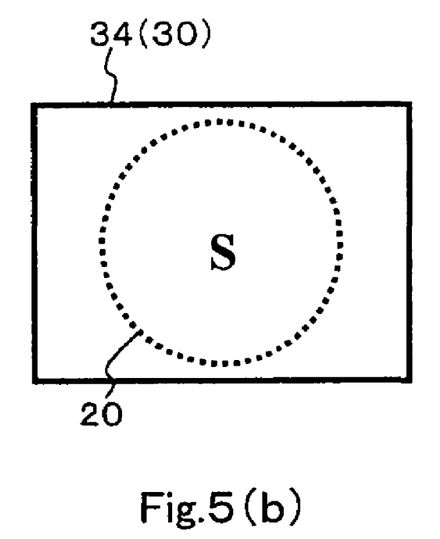
FIG. 5(b) shows a front view seen from the right side in FIG. 5(a)

As shown in FIGS. 1 and 2, the individual permanent magnets 20 to 23 are completely surrounded by heat releasing members 30 which are parts of the cooling unit. FIGS. 5(a) and 5(b) show schematic views showing states where the permanent magnet 20 as a representative is surrounded by the heat releasing members. FIG. 5(a) shows a side view of the vicinity of the permanent magnet to which the heat releasing member is attached, and FIG. 5(b) shows a front view seen from the right side in FIG. 5(a). In FIGS. 5(a) and 5(b), the permanent magnet 20 is represented by a dotted line, is embedded into a copper cluster 32 in a block shape, and is simultaneously covered by a copper cover 34. Thus the permanent magnet 20 is completely surrounded by the heat releasing member 30 including the copper cluster 32 and the copper cover 34. This holds true with the other permanent magnets 21 to 23.

This heat releasing member 30 releases the heat from the permanent magnet 20, and restrains the heat accumulation. While the material of the heat releasing member 30 is copper in this embodiment, the material is not limited to copper. Any material which has high heat conductivity, or has a high withstand temperature is applicable, and especially copper and carbon (graphite), which have high heat conductivity, and tungsten, molybdenum, and tantalum, which have a high withstand temperature, are preferable.

In this embodiment, as shown in FIGS. 1 and 2, a tube (cooling tube) 36 across the insides of the four heat releasing members 30 enclosing the permanent magnets 20 to 23, and a tube (cooling tube) 38 surrounding the outsides of the heat releasing members 30 are respectively installed, and water circulates through these tubes.

In this embodiment, since the heat releasing members 30 release heat from the permanent magnets 20 to 23, and further, the heat releasing members 30 are cooled by the water circulating through the tubes 36 and 38, the heating of the permanent magnets 20 to 23 is efficiently restrained. Note that, the coolant circulating through the tubes 36 and 38 is not limited to water, and any conventional publicly known coolant, whether it is liquid or gas, is applicable. Specific examples of the coolant other than water include nitrogen gas, ethylene glycol, liquid nitrogen, and liquid helium. In addition, a material with high heat conductivity is preferable for the material of the tubes 36 and 38, and a material similar to that of the heat releasing member 30 is suitably applied.

While in this embodiment, the form where both the heat releasing member and the forced cooling using the coolant are combined is described as an example of the cooling unit, it is not necessarily to combine both of them, and it is possible to properly select either of them, or to combine with another cooling unit as long as a desired cooling effect is achieved. Whenever any one of these cooling units is used, it is preferable to use the cooling unit for controlling such that the temperature of the permanent magnets 20 to 23 does not reach Curie temperature during manufacturing the carbon nanotubes.

Examples of the cooling unit include a unit which uses a fan to blow air to the magnets and/or other cooling units, and a unit which uses a Peltier element to cool the magnets and/or other cooling units.

In this embodiment, since the heat releasing member is combined with the forced cooling with the coolant, a member in a cluster shape is used so as to efficiently conduct heat to the coolant. However, in a form where only the heat releasing member, the heat releasing member combined with a fan, or the like, it is preferable to use an increased surface area such as a form including a large number of fins so as to increase the heat releasing efficiency.

On the other hand, in this embodiment, though the two tubes 36 and 38 are provided as the cooling tubes, it should be understood that two tubes are not always necessary, and one tube or three tubes may be used according to desired cooling efficiency.

Next, description will be made of an example of manufacturing carbon nanotubes with the carbon nanotube manufacturing apparatus shown in FIG. 1.

The reaction container (chamber) 10 is a sealed container in a cylindrical shape (disposed such that the end surfaces face upward and downward respectively in the drawing), and though the container is preferably made of metal, especially stainless steel, it may be suitably made of aluminum alloy, quartz, and the like. Additionally, the shape is not limited to a cylindrical shape, and a desired shape such as a box shape may be used. Further, when the atmosphere of the discharge area is an atmosphere of air at an atmospheric pressure, and the carbon nanotubes are deposited around the tip of the electrode 11, the reaction container 10 is not indispensable, or the reaction container 10 is not necessarily a sealed container.

The two electrodes 11 and 12 whose tips are opposed to each other are disposed in the reaction container 10. Under this condition, when the material of the reaction container 10 is the one having electric conductivity such as metal, the reaction container 10 and the electrodes 11 and 12 are fixed while they are electrically insulated from each other. As the arrangement of the two electrodes 11 and 12, such an arrangement that the axes of the two electrodes 11 and 12 have a certain angle and the tips are close to each other is possible in addition to the arrangement shown in FIG. 1 where the axes of both of them coincide with each other so that both of them are opposed to each other exactly. In the present invention, the concept, "the tips are opposed to each other", includes the case where the two axes have an angle. It should of course be understood that the form shown in FIG. 1 is preferable.

As for the arrangement of the electrodes 11 and 12, when the opposing surfaces of the electrodes 11 and 12 are in parallel, the discharge such as arc discharge is stabilized, and the carbon nanotubes are synthesized efficiently.

Though carbon is preferable as the material of the two electrodes 11 and 12, a material which contains carbon, and has electric resistivity 0.01 $\Omega$·cm or more and 10 $\Omega$·cm or less (preferably 0.01 $\Omega$·cm or more and 1 $\Omega$·cm or less) is suitably applied.

The shape of the two electrodes 11 and 12 are not limited, and though examples of the shape may include cylindrical shape, rectangular column shape, and truncated cone shape, the cylindrical shape is desirable. In addition, though the diameter of the tip (in the case where the tip is not circular, the diameter of a circle having the same area as the tip) of the two electrodes 11 and 12 is not especially limited, the diameter is preferably 1 mm or more and 100 mm or less.

As for the opposing two electrodes 11 and 12, the area of the tip of the electrode 11 is preferably equal to or less than the area of the tip of the electrode 12. The purity of the obtained carbon nanotubes increases further when the area of the tip of the electrode 11 is equal to or less than the area of the tip of the electrode 12. The ratio of the areas between them (the tip area of the electrode 11/the tip area of the electrode 12) is preferably 0.1 to 0.9, more preferably 0.2 to 0.5.

A coolant circulating pipe (not shown) as an electrode cooling unit is attached to the holders 41 and 42 holding the two opposing electrodes 11 and 12. The heat generated when the discharge plasma is formed heats the electrodes 11 and 12. The shape of the electrodes changes when the electrodes are heated to a high temperature, and the discharge condition may change. When the heating progresses to an extremely higher temperature, the carbon nanotubes deposited at the top of the electrode may be decomposed again or vaporized. However, since the coolant circulating pipe attached to the holders 41 and 42 restrains the electrodes 11 and 12 from being heated, and thus, it is possible to maintain stably generating the discharge plasma for even a longer period.

Though the routing of the coolant circulating pipe is not especially restricted, it is preferable to efficiently route to effectively cool the electrodes 11 and 12. There is no restriction to the material of the coolant circulating pipe and the type of the coolant, and it is possible to properly apply ones similar to the tubes 36 and 38 and the coolant, referred in the description for the magnet cooling unit.

Copper having high heat conductivity is also used for the holders 41 and 42. Thus, the holders 41 and 42 serve in away similar to the heat releasing member 30 referred in the description for the magnet cooling unit. In this respect, the structure itself of the holders 41 and 42 can be considered as a type of the electrode cooling unit.

The electrode cooling unit is not limited to the constitution described above, and a constitution in which the individual electrodes can be cooled may be used without problems. Examples of the constitution may include the fan and the fin type heat releasing member referred in the description for the magnet cooling unit.

Note that while both of the holders 41 and 42 are constituted so as to serve also as the electrode cooling unit in this embodiment, only one electrode may be provided with the electrode cooling unit. It is of course desirable that both of the electrodes are provided with the electrode cooling unit. However, if only one electrode is provided with the electrode cooling unit, the cathode on which the carbon nanotubes are generated and deposited is preferably provided with the electrode cooling unit.

By using the atmosphere adjusting unit including the vacuum pump 14, the gas cylinder 17, the inlet tube 15, and the valve 19 to properly adjust the atmosphere inside the reaction container 10, the atmosphere in the discharge area is set to a desired state. Specifically, the vacuum pump 14 can compress and decompress the inside of the reaction container 10. After the inside of the reaction container 10 is decompressed by the vacuum pump 14, the valve 19 is opened, and desired gas stored in the gas cylinder 17 is introduced into the reaction container 10 through the inlet tube 15, thereby obtaining the desired gas atmosphere. It should be understood that the operation for adjusting the atmosphere is not necessary when the atmosphere is the atmosphere of air at the atmospheric pressure.

The vacuum pump 14 may be a rotary pump, a diffusion pump, a turbo molecule pump, or the like.

The pressure of the atmosphere inside the reaction container 10 (namely the atmosphere in the discharge area, used in the same sense hereafter) maybe 0.01 Pa or more and 510 kpa or less, preferably, 0.1 Pa or more and 105 kPa or less, and more preferably 13 Pa or more and 70 kPa or less. With such a pressure, carbon nanotubes with high purity can be manufactured. When a pressure lower than the pressure range described above, fullerenes with high purity can be produced.

Although the atmospheric gas in the reaction container 10 is not specifically limited, air, helium, argon, xenon, neon, nitrogen, hydrogen, and mixture of these types of gas are preferable. When desired gas is introduced, after the inside of the reaction container 10 is exhausted by the vacuum pump 14, the desired gas is introduced up to a predetermined pressure from the gas cylinder 17.

In the present invention, the atmosphere inside the reaction container 10 may further store gas including a material containing carbon. In this case, the atmosphere may only include the gas including the material containing carbon, or the gas including the material containing carbon may be introduced into the atmosphere of the different types of gas described above. By adding the gas including the material containing carbon to the atmosphere, it is possible to produce carbon nanotubes with a special structure. This carbon nanotube has a structure of carbon grown around a carbon nanotube as the center.

Although the applicable material containing carbon is not limited thereto, hydrocarbon such as ethane, methane, propane, and hexane; alcohol such as ethanol, methanol, and propanol; ketone such as acetone; petroleum; gasoline; or inorganic substance such as carbon monoxide, and carbon dioxide; or the like, can be used. Acetone, ethanol, and hexane are especially preferable.

Anything that generates magnetic force may be used as the permanent magnets 20 to 23 serving as the magnets. As described above, the electromagnet may be applied in place of the permanent magnet. Examples of the predetermined magnetic field to be formed include ones with the shape shown in FIGS. 3(*a*), 3(*b*), 4(*a*), and 4(*b*) as described above. In the carbon nanotube manufacturing apparatus in FIG. 1, the two types of magnetic fields shown in FIGS. 3(*a*) and 3(*b*) are selectable.

In the predetermined magnetic field to be formed, when the lines of magnetic force in the discharge area include more components which are approximately in parallel with the axes of the electrodes 11 and 12 (namely, the direction of the discharge current formed between the electrodes 11 and 12), high purity carbon nanotubes are manufactured, and thus, this condition is preferable. Namely, the magnetic field in FIG. 3(*a*) is preferable to the one in FIG. 3(*b*). The arrangement in FIG. 3(*a*) is used in this embodiment.

In the carbon nanotube manufacturing apparatus of FIG. 1 on which the conditions described above are set, by applying the voltage from the power supply 18 between the electrodes 11 and 12, discharge plasma is generated between the electrodes 11 and 12. Though the types of the discharge plasma include arc plasma, glow plasma, and the like, arc plasma is preferable for efficiently manufacturing carbon nanotubes.

When the arc discharge is generated, contact arc process may be conducted before the generation. The contact arc process is a process where, after the voltage is applied while the electrodes 11 and 12 are in contact with each other, the moving apparatus 13 separates the electrodes 11 and 12 to a certain inter-electrode distance, and the discharge plasma is generated. With this process, stable discharge plasma is generated easily and quickly.

Though the voltage applied between the electrodes 11 and 12 may be DC or AC, DC is preferable for increasing the purity of the obtained carbon nanotubes. When AC is applied, there is no distinction between the electrodes 11 and 12 in terms of polarity.

The current density of the discharge when the discharge plasma is generated is preferably 0.05 A/mm$^2$ or more and 15 A/mm$^2$ or less, and more preferably 1 A/mm$^2$ or more and 5 A/mm$^2$ or less with respect to the area of the tip of the electrode generating the discharge plasma. "The electrode generating the discharge plasma" means the cathode when the applied voltage is DC, and when the applied voltage is AC, it means the electrode with the smaller tip area (this holds true throughout the description in the present invention).

The voltage applied between the electrodes 11 and 12 by the power supply 18 is preferably 1 V or more, and 30 V or less, and more preferably 15 V or more and 25 V or less. Since as a result of the discharge, the tip of the electrode 12 is consumed, the interval between the electrodes 11 and 12 changes during the discharge. It is preferable to control the voltage between the electrodes 11 and 12 to become constant by properly adjusting the interval between the electrodes 11 and 12 using the moving apparatus 13.

The magnetic flux density in the predetermined magnetic field is preferably $10^{-5}$ T or more and 1 T or less at the tip of the electrode generating the discharge plasma of the two opposing electrodes 11 and 12. When the magnetic flux density is less than $10^{-5}$ T, it is difficult to form an effective magnetic field, and when the magnetic flux density exceeds 1 T, it maybe difficult to dispose the permanent magnets 20 to 23, which generate the magnetic field inside the apparatus, close to the generation area of the discharge plasma. Thus, both the cases are not preferable. When the magnetic flux density is $10^{-4}$ T or more and $10^{-2}$ T or less, since stable discharge is generated, it is possible to efficiently generate carbon nanotubes.

When the discharge plasma is generated between the electrodes 11 and 12 as described above, carbon is separated from the surface of the electrode 11, and then reacts to generate carbon nanotubes. The generated carbon nanotubes are deposited on the surface of the tip of the electrode 11, a neighborhood of it, and also the inner wall of the reaction container 10.

As described above, since the cooling unit (the heat releasing member 30 and the tubes 36 and 38) is provided to cool the permanent magnets 20 to 23 in this embodiment, the heating of the permanent magnets 20 to 23 is restrained, and it is possible to maintain stably generating discharge plasma for a long period.

When the discharge plasma is generated in the predetermined magnetic field, it was found out for the first time that the length of the carbon nanotubes is controlled according to the discharge period. Thus, with this embodiment, it is possible to properly control the shape, especially the length, of the carbon nanotubes. Though the reason has not been determined yet, since there is no such finding that the length of the carbon nanotubes changes as the discharge period changes when a magnetic field does not exist, it is sure that the generation of the discharge plasma in the predetermined magnetic field is crucial point.

In general, when carbon nanotubes are manufactured with arc discharge or the like, amorphous carbon, graphite particles, and the like generated simultaneously are deposited on the electrode and the like along with the carbon nanotubes. Namely, since other impurities are generated along with the carbon nanotubes, the supplied carbon source does not always contribute to the growth of the carbon nanotubes.

However, when the discharge plasma is generated in the predetermined magnetic field, since the discharge plasma including radicals such as $C^+$, C, and $C_2$ is confined in the magnetic field, the probability of the collision of the charged particles with one another in the discharge plasma increases, and the efficiency of generating the carbon nanotubes increases. Though it is sure that the increase in the efficiency of generating the carbon nanotubes directly leads to the increase in the purity of the carbon nanotubes, it is speculated that it simultaneously affects the growth of the individual carbon nanotubes. Namely, in the general arc discharge and the like having low efficiency of generating carbon nanotubes, a large amount of other impurities have generated and are deposited together with carbon nanotubes before the individual carbon nanotubes have sufficiently grown, and thus, the length of the carbon nanotubes does not increase even if the discharge period is extended. However, with the present invention, it is speculated that factors obstructing the growth of the individual carbon nanotubes are reduced, and the length of the individual carbon nanotubes changes according to the discharge period. Note that the assumption described above has not been confirmed yet.

Figure 6:
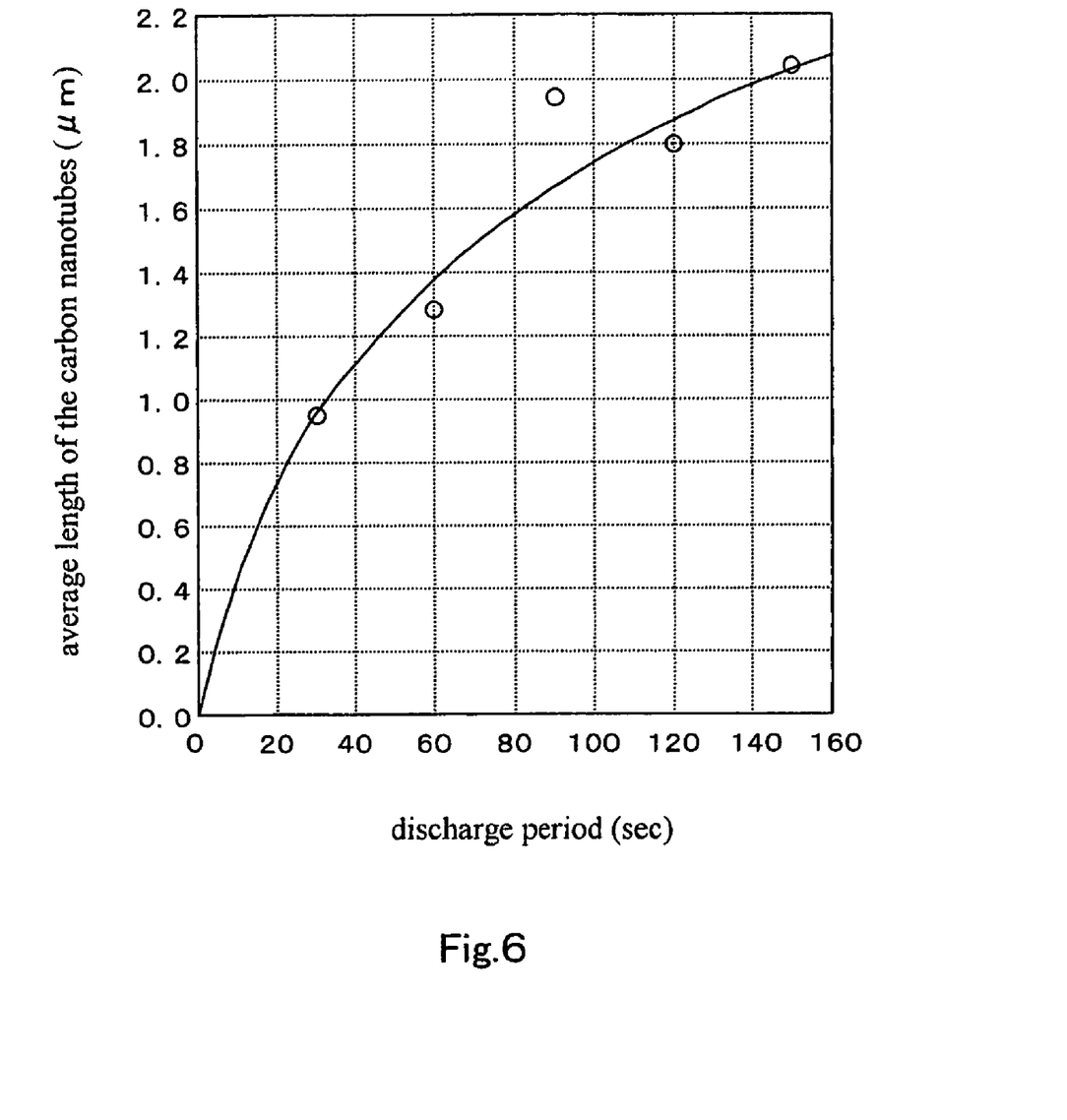
FIG. 6 is a graph showing a relationship between the average length of carbon nanotubes obtained by an example, and a discharge period, in which the vertical axis indicates the average length (μm) of the carbon nanotubes, and the horizontal axis indicates the discharge period (sec).

Though specific verification will be described by way of an example below, the length of the carbon nanotubes increases as the discharge period extends as shown in FIG. 6. Based on a graph in FIG. 6, it is speculated that the length of the carbon nanotubes saturates when the discharge period is sufficiently long.

Since the period of applying the voltage depends on the discharge voltage, the discharge environment, the state of the magnetic field, the various temperatures, the shape and the type of the electrodes and the like, and thus, is not generalized, the period should be properly selected. When it is necessary to control the average length of the manufactured carbon nanotubes more precisely, the discharge period realizing the desired length of the carbon nanotubes is selected after the working curve for the discharge period and the average length of the carbon nanotubes is obtained in advance.

As described above, with the present invention, by manufacturing carbon nanotubes with discharge plasma such as arc discharge which enables simple manufacturing and requires only low cost, it is possible to obtain high purity carbon nanotubes while properly controlling the shape, especially the length.

EXAMPLE

Hereinafter, based on an example, description will be made in detail of the present invention. However the present invention is not limited to the example.

In the example 1, carbon nanotubes are manufactured with the carbon nanotube manufacturing apparatus shown in FIG. 1.

Hereinafter, description will be made of specific requirements for the individual constitution.

Reaction container 10: a cylindrical container chamber made of stainless steel. 210 mm in diameter and 380 mm in length.

Electrode (cathode) 11: A cylindrical graphite rod with an outer diameter of 5 mm (purity: 99.9% or more).

Electrode (anode) 12: A cylindrical graphite rod with an outer diameter of 15 mm (purity: 99.9% or more).

Tip position of the electrode 11: 9 mm below the midpoint between the imaginary plane X and the imaginary plane Y (2 mm above the imaginary plane Y).

Moving apparatus 13: Capable of moving the electrode 11 with a stepping motor. Adjusts to maintain the interval between the electrodes 11 and 12 constant during plasma discharge.

Power supply 18: A DC arc welding power supply (Osaka Denki AR-SB300) controlling the current from 20 A to 300 A.

Permanent magnets 20 to 23: Cylindrical NdFB permanent magnets with diameter of 22 mm and thickness of 10 mm (Niroku Seisakusho). The permanent magnets 20 to 23 are incorporated as the cooling unit as shown in FIG. 1, FIG. 3(a) and FIG. 3(b). In this state, in more detail, as shown in FIG. 2, the permanent magnets 20 to 23 are embedded into the heat releasing member 30 (length: 50 mm, width: 40 mm, thickness: 25 mm, and the thickness of the copper cover 34: 2.5 mm). The copper tubes 36 and 38 are further routed, the coolant is circulated through the tubes 36 and 38, and the temperature is controlled so as to maintain the temperature of the permanent magnets 20 to 23 below 100° C. during the discharge. As a result, the temperature of the permanent magnets 20 to 23 does not exceed Curie point during the discharge. The minimum distance between the opposing permanent magnets is 82 mm. The magnetic flux density at the edge of the tip of the electrode 11 is 7 mT.

Holder 41: A copper cylinder with a diameter of 30 mm and a length of 80 mm. The coolant circulating pipe through which water circulates is routed inside the holder so as to control the temperature at the tip of the electrode 11 within 300° C.

Holder 42: A copper cylinder with a diameter of 40 mm and a length of 120 mm. The coolant circulating pipe through which water circulates is routed inside the holder so as to control the temperature at the tip of the electrode 12 within 300° C.

The manufacturing apparatus described above was used to manufacture carbon nanotubes. The inside of there action container 10 was not decompressed, and the operation was conducted at 101.325 kPa (one atmospheric pressure). To generate arc discharge between the electrodes 11 and 12, the contact arc process was conducted first, and then, the electrodes 11 and 12 were separated by 0.5 mm to 3 mm after the start of the discharge. The voltage applied by the power supply 18 is DC 18 V. The arc discharge was conducted under the conditions described above while five levels including 30 seconds, 60 seconds, 90 seconds, 120 seconds, and 150 seconds were set as the discharge period. The current was 40 A, and the discharge current density with respect to the tip area of the electrode 11 was 2.0 A/mm$^2$.

After the discharge, the electrode 11 was taken out, and the tip was observed using a scanning electron microscope. Hitachi scanning electron microscope S-4500 was used for the observation using the scanning electron microscope, and the magnitude was 2000. As a result of the observation using the scanning electron microscope, it was confirmed that high purity (about 95%) carbon nanotubes were generated.

Then, the sample was observed using a transmission electron microscope. Hitachi transmission electron microscope H-9000NA was used for the observation using the transmission electron microscope, and the magnitude was 5000 to 30000. The length of 100 to 200 carbon nanotubes in an observation area was actually measured, and the average length was calculated for the individual discharge period. FIG. 6 shows the result. FIG. 6 is a graph showing the relationship between the average length (μm) of the carbon nanotubes obtained by this example, and the discharge period (sec). As FIG. 6 shows, with this example, by properly adjusting the discharge period, the length of the obtained carbon nanotubes can be adjusted.

As described above, the present invention provides a manufacturing apparatus and method which can efficiently synthesize high purity carbon nanotubes with extremely low concentration of impurities such as amorphous carbon particles and the graphite particles on an industrial basis, and simultaneously can properly control the shape, especially the length, of the obtained carbon nanotubes.

Since the manufacturing apparatus and the manufacturing method for a carbon nanotube according to the present invention provide extremely large effect while the constitution is simple, their industrial value is extremely high.

In the field of manufacturing carbon nanotubes where it was not possible to estimate what carbon nanotubes would be manufactured until they were actually produced, the manufacturing apparatus and the manufacturing method for a carbon nanotube according to the present invention, which can properly control the shape, especially the length, of the carbon nanotubes at the manufacturing stage without purification or separation, have extremely high value, and can bring about a rapid technical innovation in this field.

What is claimed is:

1. An apparatus for manufacturing a carbon nanotube, comprising:
   at least two electrodes whose tips oppose to each other;
   a power supply which applies a voltage between the electrodes so as to generate discharge plasma in a discharge area between the electrodes;
   a plurality of magnets which generates at least one of a magnetic field of multiple directions and a magnetic field having a component in parallel with the direction of a discharge current in the generation area of the discharge plasma; and
   a magnet cooling unit which cools the magnets.

2. An apparatus for manufacturing a carbon nanotube according to claim 1, wherein the magnet cooling unit is formed by attaching a heat releasing member to the magnets.

3. An apparatus for manufacturing a carbon nanotube according to claim 1, wherein the magnet cooling unit is formed by bringing a cooling tube in contact with the magnets, and circulates a coolant in the cooling tube.

4. An apparatus for manufacturing a carbon nanotube according to claim 1, further comprising an electrode cooling unit which cools at least one of the two electrodes.

5. An apparatus for manufacturing a carbon nanotube according to claim 1, wherein the discharge plasma generated in the discharge area is arc plasma.

6. An apparatus for manufacturing a carbon nanotube according to claim 1, wherein:
   the plural magnets are selected from the group consisting of permanent magnets and electromagnets arranged along the direction of the discharge current so as to surround at least of the generation area of the discharge plasma and an area close the generation area; and
   each of the plurality of magnets is arranged to direct the same pole toward the discharging area.

7. An apparatus for manufacturing a carbon nanotube according to claim 1, wherein:
   the plurality of magnets includes even number of magnets, equal to or greater than four, selected from the group consisting of permanent magnets and electromagnets arranged along the direction of the discharge current so as to surround at least one of the generation area of the discharge plasma and an area close to the generation area; and
   each of the plurality of magnets is arranged to have a pole opposite to that of the adjacent magnet directed toward the discharging area.

8. An apparatus for manufacturing a carbon nanotube according to claim 1, wherein the magnets are formed of one of one and two coils whose center axis is approximately aligned to the direction of the discharge current.

9. An apparatus for manufacturing a carbon nanotube according to claim 1, wherein, of the two electrodes, the magnetic flux density at an edge of the tip of the electrode which generates the discharge plasma is equal to or more than $10^{-5}$ T and equal to or less than 1 T.

10. An apparatus for manufacturing a carbon nanotube according to claim 1, wherein a density of the discharge current when the discharge plasma is generated is 0.05 A/mm$^2$ or more and 15 A/mm$^2$ or less with respect to an area of the tip of the electrode which generates the discharge plasma.

11. An apparatus for manufacturing a carbon nanotube according to claim 1, wherein the voltage applied to the electrodes by the power supply is equal to or more than 1 V and equal to or less than 30 V.

12. An apparatus for manufacturing a carbon nanotube according to claim 1, wherein the voltage applied to the electrodes by the power supply is a DC voltage.

13. An apparatus for manufacturing a carbon nanotube according to claim 1, wherein:
   the voltage applied to the electrodes by the power supply is a DC voltage; and
   the area of the tip of a cathode of the two opposing electrodes is equal to or less than the area of the tip of an anode thereof.

14. An apparatus for manufacturing a carbon nanotube according to claim 1, wherein at least the discharge area and the electrodes are received in a sealed container.

15. An apparatus for manufacturing a carbon nanotube according to claim 1, further comprising an atmosphere adjusting unit which adjusts at least one of a pressure and a gas of an atmosphere in a sealed container, wherein at least the discharge area and the electrodes are received in the sealed container.

16. An apparatus for manufacturing a carbon nanotube according to claim 1, wherein the material of the electrodes is one of carbon and a substance which contains carbon and has an electric resistivity equal to or more than 0.01 Ω·cm and equal to or less than 10 Ω·cm.

17. A method of manufacturing a carbon nanotube by applying a voltage between two electrodes whose tips oppose to each other, and then, generating discharge plasma in a discharge area between the electrodes, the method comprising:
   using a plurality of magnets to generate at least one of a magnetic field of multiple directions and a magnetic field having a component in parallel with the direction of a discharge current in the generation area of the discharge plasma; and
   cooling the plurality of magnets.

18. A method of manufacturing a carbon nanotube according to claim 17, further comprising controlling a temperature of the plural magnets under a Curie temperature.

19. A method of manufacturing a carbon nanotube according to claim 17, further comprising controlling a period of time when the voltage is applied between the two electrodes appropriately.

20. A method of manufacturing a carbon nanotube according to claim 17, further comprising cooling the two electrodes.

21. A method of manufacturing a carbon nanotube according to claim 17, wherein the discharge plasma generated in the discharge area is arc plasma.

22. A method of manufacturing a carbon nanotube according to claim 17, further comprising forming the magnetic field by arranging the plural magnets selected from the group consisting of permanent magnets and electromagnets along the direction of the discharge current so as to surround at least one of the generation area of the discharge plasma and an area close to the generation area and such that each of the plural magnets is arranged to direct the same pole toward the discharging area.

23. A method of manufacturing a carbon nanotube according to claim 17, further comprising forming the magnetic field by arranging even number of magnets, equal to or greater than four, selected from the group consisting of permanent magnets and electromagnets along the direction of the discharge current so as to surround at least one of the generation area of the discharge plasma and an area close to the generation area and such that each of the plural magnets has a pole opposite to that of the adjacent magnet directed toward the discharging area.

24. A method of manufacturing a carbon nanotube according to claim 17, wherein the magnetic field is formed by disposing one of one and two coils whose center axis is approximately aligned to the direction of the discharge current.

25. A method of manufacturing a carbon nanotube according to claim 17, wherein, of the two electrodes, the magnetic flux density at an edge of the tip of the electrode which generates the discharge plasma is equal to or more than $10^{-5}$ T and equal to or less than 1 T.

26. A method of manufacturing a carbon nanotube according to claim 17, wherein a density of the discharge current when the discharge plasma is generated is 0.05 A/mm² or more and 15 A/mm² or less with respect to an area of the tip of the electrode which generates the discharge plasma.

27. A method of manufacturing a carbon nanotube according to claim 17, wherein the voltage applied to the electrodes is equal to or more than 1 V and equal to or less than 30 V.

28. A method of manufacturing a carbon nanotube according to claim 17, wherein the voltage applied to the electrodes by the power supply is a DC voltage.

29. A method of manufacturing a carbon nanotube according to claim 17, wherein:
   the voltage applied to the electrodes by the power supply is a DC voltage; and
   the area of the tip of a cathode of the two opposing electrodes is equal to or less than the area of the tip of an anode thereof.

30. A method of manufacturing a carbon nanotube according to claim 17, wherein the material of the electrodes is one of carbon and a substance which contains carbon and has an electric resistivity equal to or more than 0.01 Ω·cm and equal to or less than 10 Ω·cm.

31. A method of manufacturing a carbon nanotube according to claim 17, wherein a pressure of an atmosphere of the discharge area is equal to or more than 0.01 Pa and equal to or less than 510 kPa.

32. A method of manufacturing a carbon nanotube according to claim 17, wherein an atmosphere of the discharge area is a gas atmosphere which contains at least one of gases selected from the group consisting of air, helium, argon, xenon, neon, nitrogen, and hydrogen.

33. A method of manufacturing a carbon nanotube according to claim 17, wherein an atmosphere of the discharge area further includes a gas which includes a substance containing carbon.

* * * * *